(12) United States Patent
Averbuch

(10) Patent No.: US 7,411,400 B2
(45) Date of Patent: Aug. 12, 2008

(54) METHOD FOR TESTING BATTERY CONDITION

(75) Inventor: Moshe Averbuch, Beer Sheva (IL)

(73) Assignee: Battery Control Corp., Newark, DE (US)

( * ) Notice: Subject to any disclaimer, the term of this patent is extended or adjusted under 35 U.S.C. 154(b) by 358 days.

(21) Appl. No.: 10/707,521

(22) Filed: Dec. 19, 2003

(65) Prior Publication Data

US 2005/0134282 A1 Jun. 23, 2005

(51) Int. Cl.
*G01N 27/416* (2006.01)
(52) U.S. Cl. .................................................... 324/433
(58) Field of Classification Search .................. 320/101, 320/132, 149; 324/426, 427, 430, 433
See application file for complete search history.

(56) References Cited

U.S. PATENT DOCUMENTS

| | | | |
|---|---|---|---|
| 5,598,098 A | 1/1997 | Champlin | |
| 6,366,054 B1 | 4/2002 | Hoening | |
| 6,369,577 B1 | 4/2002 | Cho | |
| 6,441,585 B1 | 8/2002 | Bertness | |

*Primary Examiner*—Edward Tso
(74) *Attorney, Agent, or Firm*—Martin Fleit; Paul D. Bianco; Fleit Kain Gibbons Gutman Bongini & Bianco P.L.

(57) ABSTRACT

According to this invention a battery testing device is provided. Such device activates a shortening between the battery poles using a predefined electronic circuit (in order to maximize the battery's energy potential) for a time period of 10-50 μsec. In a subsequent time period of ~100-200 μsec, the loading is slowly decreased until the voltage returns to an open circuit voltage $U_{OC}$. During the testing process, the voltage and the battery current are measured. The measurements are stored at the device database, to be later used in an algorithm for checking battery conditions.

15 Claims, 12 Drawing Sheets

METHOD FOR TESTING BATTERY CONDITION

BACKGROUND OF INVENTION

The present invention relates to electronic battery testing and measuring. More specifically the present invention relates to a method and apparatus for measuring and checking parameters such as voltage, cold cranking amperage (CCA), state of charge (SOC) and state of health (SOH) of a standard battery.

Different methods were developed over the years in order to measure the power status and condition of lead acid batteries, such as those used in Vehicles, UPS systems, and in solar energy arrangements etc.

One such measuring method is taught in U.S. Pat. No. 5,598,098, wherein battery condition and measurement parameters are obtained through a correlation analysis. The method is based on battery conductance measurement.

Another prior art method (U.S. Pat. No. 6,441,585) uses measurements of impedance or admittance. Another, uses the measurement of OCV (U.S. Pat. No. 6,366,054). Still another prior art measurement method uses special battery loading during a limited period of time (U.S. Pat. No. 6,369,577).

In the aforementioned patents, the received measurement parameters are scaled with battery conditions by correlation analysis methods. Additionally, the tester system suggested in the aforementioned patents displays the battery's physical conditions to an operator. This prior art measurement technique is meant to be advantageous since it is executed with relatively low current. This is required for two reasons. First, it causes a minimum amount of battery discharge energy. Second, since the measurement process is long the battery can't be tested at high current conditions.

Essentially, it is desirable to check a battery's performance at high current (real time) conditions. The methods described above do not perform such test at high current conditions, but provide an estimation of high current condition results on the basis of extrapolating measurement results of tests conducted at low current conditions.

The disadvantage in using the aforementioned methods is the inaccurate results received for predicting the CCA, SOC and SOH. These inaccurate results stem from the fact that the battery performance test is executed at low current conditions over a relatively long period of time.

The aforementioned methods are also used (or-may also be used) for the purpose of predicting a battery's ability to start engines of different devices, such as of vehicles or for the purpose of measuring the voltage and current supply to a starter. The measurement results are processed and analyzed in order to determine a battery's ability to start an engine. The main drawback is that the results only reflect a successful ability to start the engine, without offering any solution for failed trials.

In most prior art methods it is not possible to estimate a battery's ability to start a specific type of vehicle's engine.

A different method for testing devices' batteries is based on checking the contact conditions between the tester clamps and the battery poles. Accurate measurements of the quality and condition of the contact between the tester clamp and battery poles are obtained by employing the Kelvin contacts (as described in patent NO. U.S. Pat. No. 5,592,092).

The Kelvin contact is based on checking the bridge balance between four clamp wires. This method is not easy to use or operate, and a more user-friendly method is in demand.

Therefore, there is a need for a battery measurement method and apparatus that provides more accurate results without damaging the battery.

Furthermore, there is a need for a method and apparatus that will predict not only the engine's ability to start, but also the ability to start at different temperature levels.

SUMMARY OF INVENTION

It is a purpose of the present invention to provide an electronic battery testing method and apparatus for determining the accurate condition of a battery without damaging the battery, based on a battery high current shortening process within minimum time period.

Another purpose of this invention is the provision of exact CCA, SOC, SOH values.

Still another object of the present invention is predicting the probability of successful engine starting in different temperatures, based on engine parameters, and battery conditions.

Yet another purpose of the present invention is to include a test for checking clamp contacts.

According to this invention, a testing process is activated by shortening between battery poles using a predefined electronic circuit (in order to maximize the battery's energy potential) for a time period of 10-50 μsec. In the next time period of ~100-200 μsec, the loading is slowly decreased until the voltage returns to an open circuit voltage $U_{OC}$. During the testing process, the voltage and the battery current are measured. The measurements are stored at the device database, to be later used in an algorithm for checking battery conditions.

In order to receive an accurate real-time status with regards to a battery's condition, it is suggested to shorten the battery poles, hence applying high current load during a very short period of time (shortening). Loading a battery for a very short time period produces up to 1000-3000 A and 8,000-20,000 W. This result may cause an irreparable damage to a tester's circuit. A very short loading time is also used in order to minimize the instant damage caused by high thermal heat produced (up to 8,000-20,000 W !) in the tester circuit (first damage). A relatively low load remaining, as well as a snubber circuit are used to minimize high voltage pick on the switch poles caused by inductive EMF which may be produced during quick switch-offs (second damage).

In one embodiment, the snubber circuit design includes a capacitor, serially connected to a parallel connected diode and resistor.

In another embodiment, the snubber circuit design includes a capacitor connected in parallel to one resistor and serially to a loading switch. The loading switch is operated for a given period of time, and different measurements are taken during this period.

The advantages of the aforementioned circuit are: a) prevention of uncontrolled rise of switch voltage; b) accumulation of switch energy which returns as a back current to the battery, thus enabling an exact SOC and SOH measurements.

c) Decreasing the loaded voltage gradually; d) Enabling to check battery loading (during charging process) with no external energy source; Analysis of physical battery conditions includes the calculation of CCA, SOC, and SOH. The analysis process is based on two different parameters: a) voltage and current measurements that were received during battery shortening; b) inputted rated parameters of the battery i.e. nominal voltage, nominal capacitance, CCA etc.

In addition, the present invention provides the ability to predict the probability of successful engine starting when using the tested battery based on input parameters relating to, for example, the specific car engine (diesel, fuel injection etc.) engine volume, number of cylinders, engine temperature etc.

Based on the engine parameters and battery condition, a mathematical model is evaluated, and the dynamic behavior of the engine system (battery-starter-engine) is predicted. Predicting battery potential can be evaluated in terms of successful starting or fault starting, or in the term of minimum temperature conditions required for starting the engine.

The last aspect of the present invention is related to checking the contact between tester clamp and battery poles. For this purpose the measurement results received during battery shorting are used. Based on the results analysis, the contacts conditions are evaluated. If the clamps' contacts condition is unsatisfying, the operator receives a special message to repeat the measurement.

DETAILED DESCRIPTION

Figure 1:
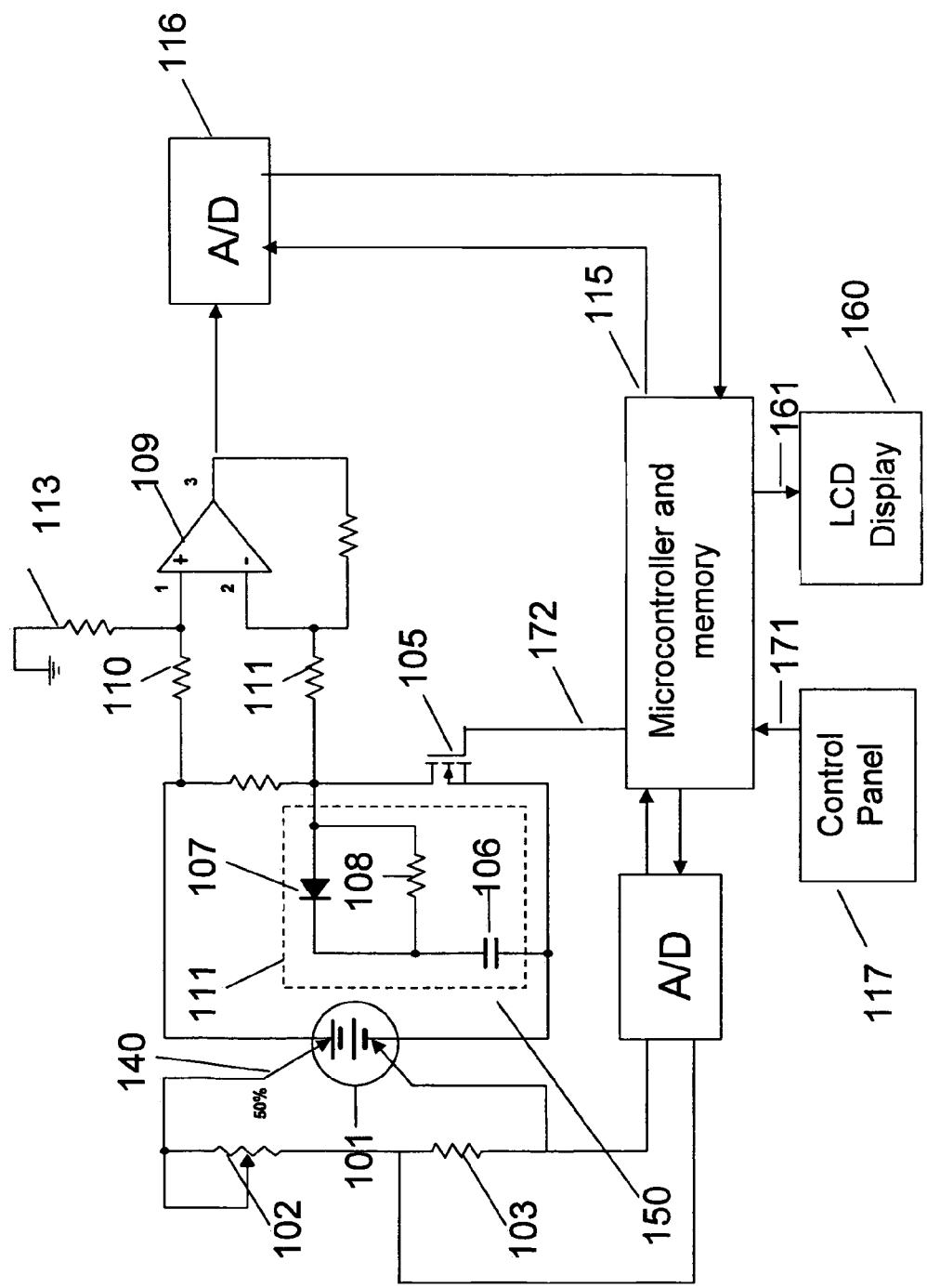
FIG. 1 is a general schematic diagram of one illustrative embodiment of the testing device in accordance with the invention.

The following describes an embodiment of the present invention. Referring to FIG. 1, a block circuit diagram 100 of a relevant portion of a testing apparatus is shown. In order to measure its potential voltage, the tested battery 101 is connected serially, by a pair of Kelvin clamps 140, to resistors 102, and 103. For receiving an accurate measurement, the voltage is divided between the resistors. Resistor 102 has varying resistance while resistor 103 has a constant resistance. Another pair of Kelvin clamps 150, connect the tested battery 101 to resistor 104, which is used as a measuring resistive shunt, and to power switch 105 (may be a MOSFET or a IGBT transistors). Snubber circuit 150 is connected in parallel to switch 105. The snubber circuit 150 comprises: a capacitor 106 connected serially to a parallel connected diode 907 and resistor 108.

A differential amplifier 109, used for measuring the current in the circuit 100, is connected by resistors 110 and 111 to shunt resistor 104.

Resistor 112 is placed at the feedback path of amplifier 109, while resistor 113 is placed between amplifier's positive pole and earth. A/D (analog-to-digital) converter 114, used for digitalizing the measured battery 101 voltage, is connected at its left side to register 103, and to microcontroller 115 at its right digital exit. Microcontroller 115 installs in its memory database of all measured data (voltage, ampere act.).

Another A/D converter 116, used for current measuring, is connected by its left side to amplifier 109 exit and by its right digital exit to microcontroller 115.

Microcontroller 115 has an output connection 161 to displayer 160 and an input connection 171 to a control panel 117, another exit 172 of the Microcontroller 115 is connected to the control input of power switch 105.

The circuit disclosed in FIG. 1 operates as follows: microcontroller 115 is initialized by control panel 117 with information which relates to the tested battery 101 (for example nominal voltage, nominal capacitance and nominal CCA) and with information which relates to the engine (for example engine type diesel, fuel injection etc., engine volume, number of cylinders, engine temperature etc.). The user is informed about the battery's condition by displayer 160, which is connected to microcontroller 115. The displayer 160 is also used for displaying special comments for correction during the measuring process. The displayer 160 can be activated by a special computer, or by another different computerized device.

Figure 2:
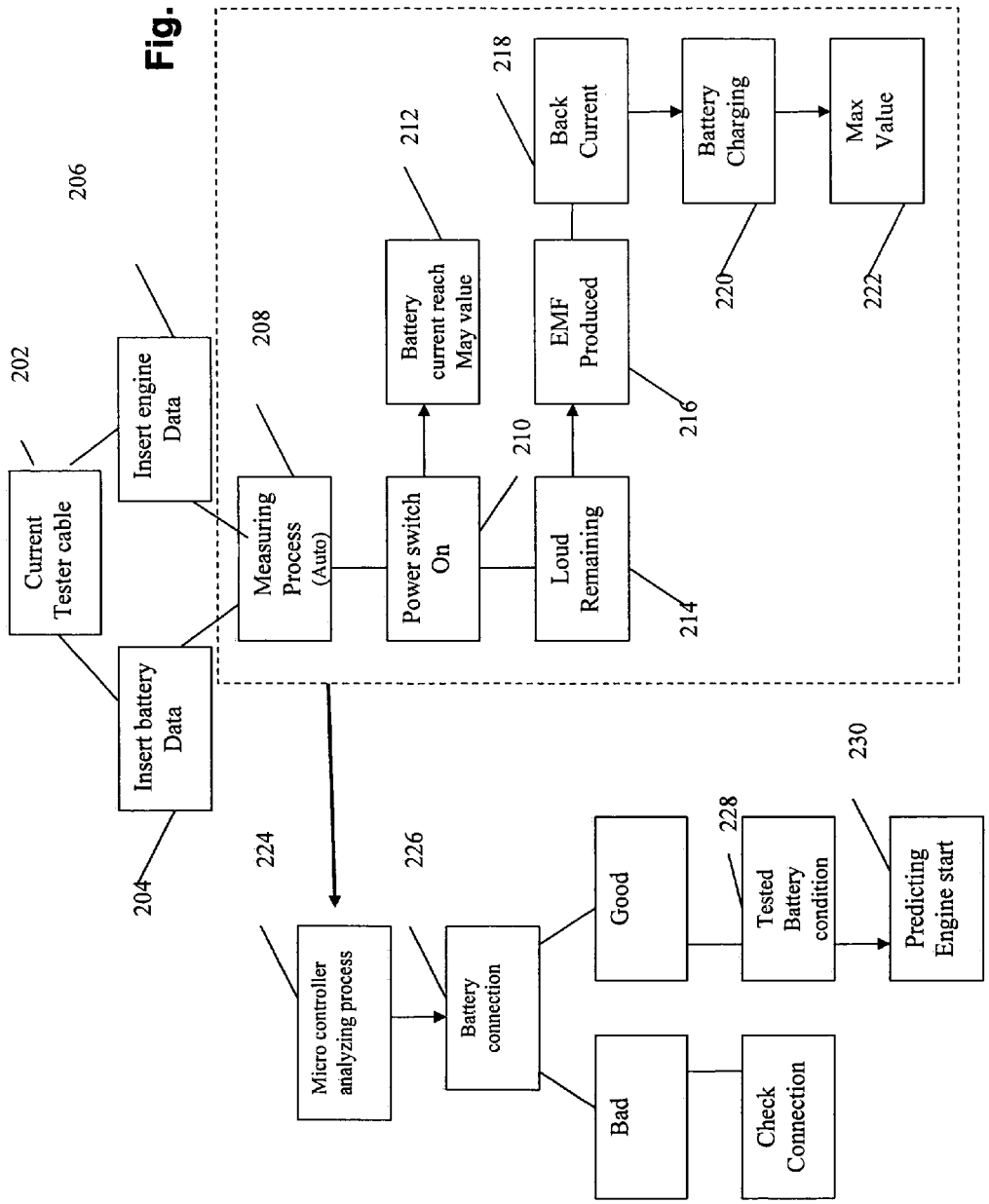
FIG. 2 is a block diagram of a measuring process for evaluating the condition of a tested battery.

FIG. 2 is a block diagram of the process 200 for evaluating the condition of a tested battery 101.

The process starts as the user connects the tester cable clamps to a battery terminal (step 202). Thereafter, two different data initializations are activated by control panel 117. For measuring battery conditions, only data which relates to the tested battery should be inserted (step 204). For measuring battery ability to start the engine, the parameters relating to the engine must be inserted (206).

After all required data is entered into the tester, the measuring process is activated manually by the user.

Then the microcontroller 115 automatically activates the power switch 905 for a time period of about 10-40 μsec (step 210). As a result, the battery current reaches its maximum value (step 212), and will stay at the maximum value through the time period of 10-40 μsec.

The microcontroller 115 slowly decreases the remaining electricity load from maximum value to zero for the next 100-200 μsec (step 214). As a result, the current decreases, and EMF is produced (216) in inductive elements (cable wires, battery etc.). The EMF of inductive elements fully charges the capacitor 106 before the battery voltage value returns to its open circuit value. As a result, capacitor 106 voltage arrives to the value which can be sufficiently higher than the $U_{OC}$ (open circuit voltage) battery voltage. This voltage has to be lower than the threshold values of the potential voltage that may damage the switch circuit (this occurs when the capacitor 106 capacity was not chosen properly).

Then, in step 220, capacitor 106 charges the tested battery 101 by producing back current, flowing through resistor 108. At the next 20-30 μsec, the tested battery voltage will rise to a maximum value 222 (higher than the battery tester initial ($U_{OC}$–) open circuit (voltage) value).

Thereafter, during a short period of time, the voltage returns to its initial values of open circuit.

During the loading process, A/D converters 116 and 103 convert the measured battery current and voltage to digital form and send them to microcontroller 115, for stacking the measurements in the microcontroller 115 memory in a digital form.

At the end of this measurement process, microcontroller 115 starts an evaluation/analyzing process 224 based on the received voltage/current data, which includes the following steps: A. Determining the connection condition between the clamps and battery terminal, step 226.

B. Calculating tested battery conditions (CCA, SOC, SOH, $R_B$(internal battery resistance) and receiving $E_B$(internal battery EMF)), step 228.

C. Predicting successful engine start up, step 230.

Displayer 160 displays the calculated parameters after a positive answer is received in step 226. i.e there aren't any connection problems between the clamps and battery terminal. If battery connection problems are found in step 226, Displayer 160 displays a request message for checking and improving the battery connections 232.

The conditions of clamps that are connected to the tested battery are examined in step 226. The conditions are determined by checking the correlation between the received minimum voltage and the measured maximum current, i.e. if the tested battery has enough voltage while the measured current is low, the connection of the tested battery should be checked.

Figure 8:
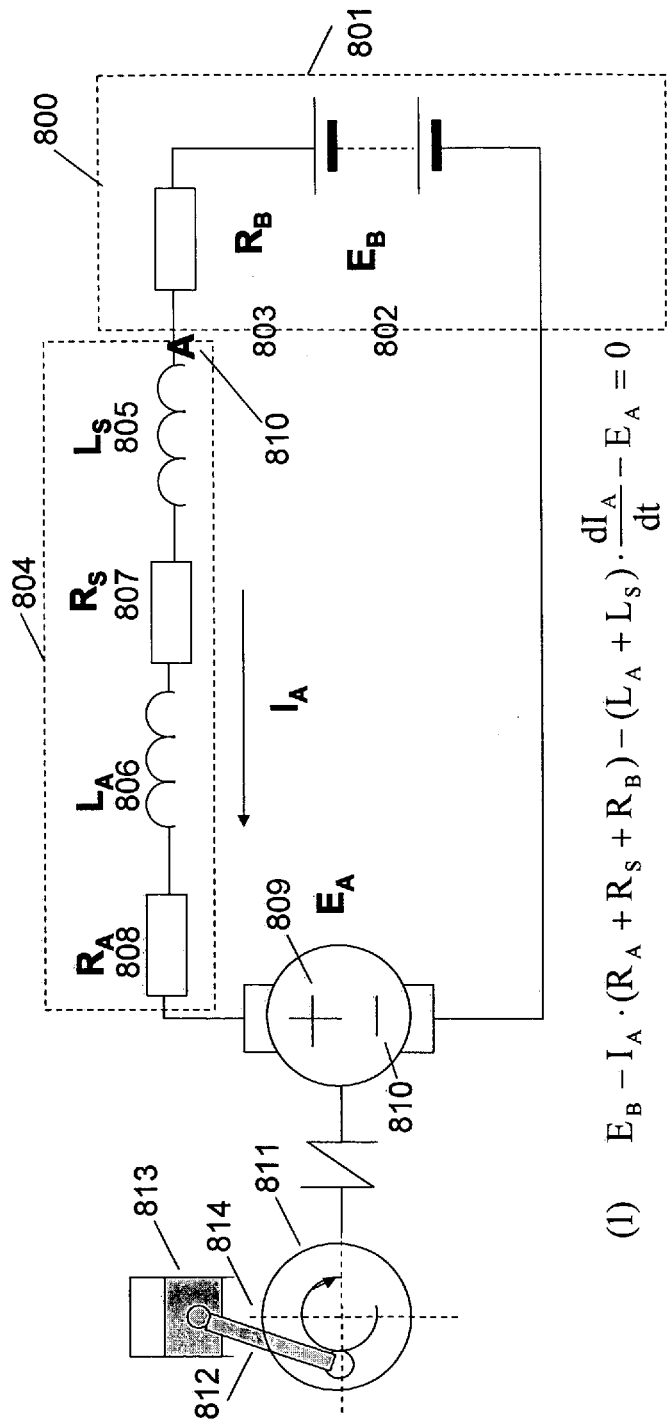
FIG. 8 shows an embodiment of an equivalent circuit according to the present invention.

The prediction of a successful engine startup 230 is determined by an algorithm method which is based on the equations presented on FIG. 8, using as input the received results from microcontroller 115 ($R_B$, $E_B$ etc.) calculated in step 228.

Figure 3:
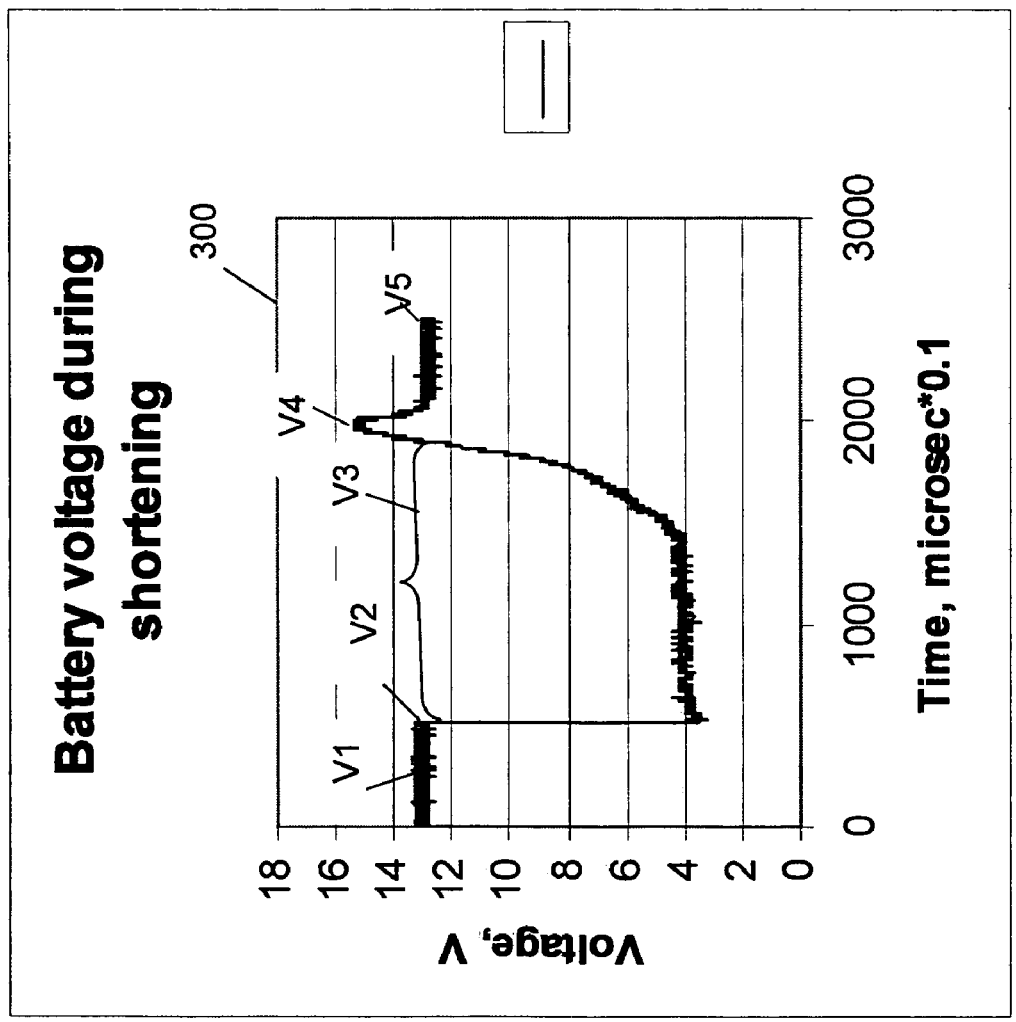
FIG. 3 is a graph of battery voltage during shortening and load remaining as a function of time.

Referring to FIG. 3, graph 300 displays voltage change during a battery shortening (V-t). The voltage has a fixed value of about ~13V during load off period (V1) and quickly decreases (V2), as the load is increased, to minimum value (5-6V or even less). As the remaining load continues to decrease, the voltage reaches to an initial value (V3), and later reaches a maximum value V4 (higher then Uoc (V1), depending on SOC and SOH of the measured battery) for a short time period, and returns to initial Uoc (V5) at the last time period.

Figure 4:
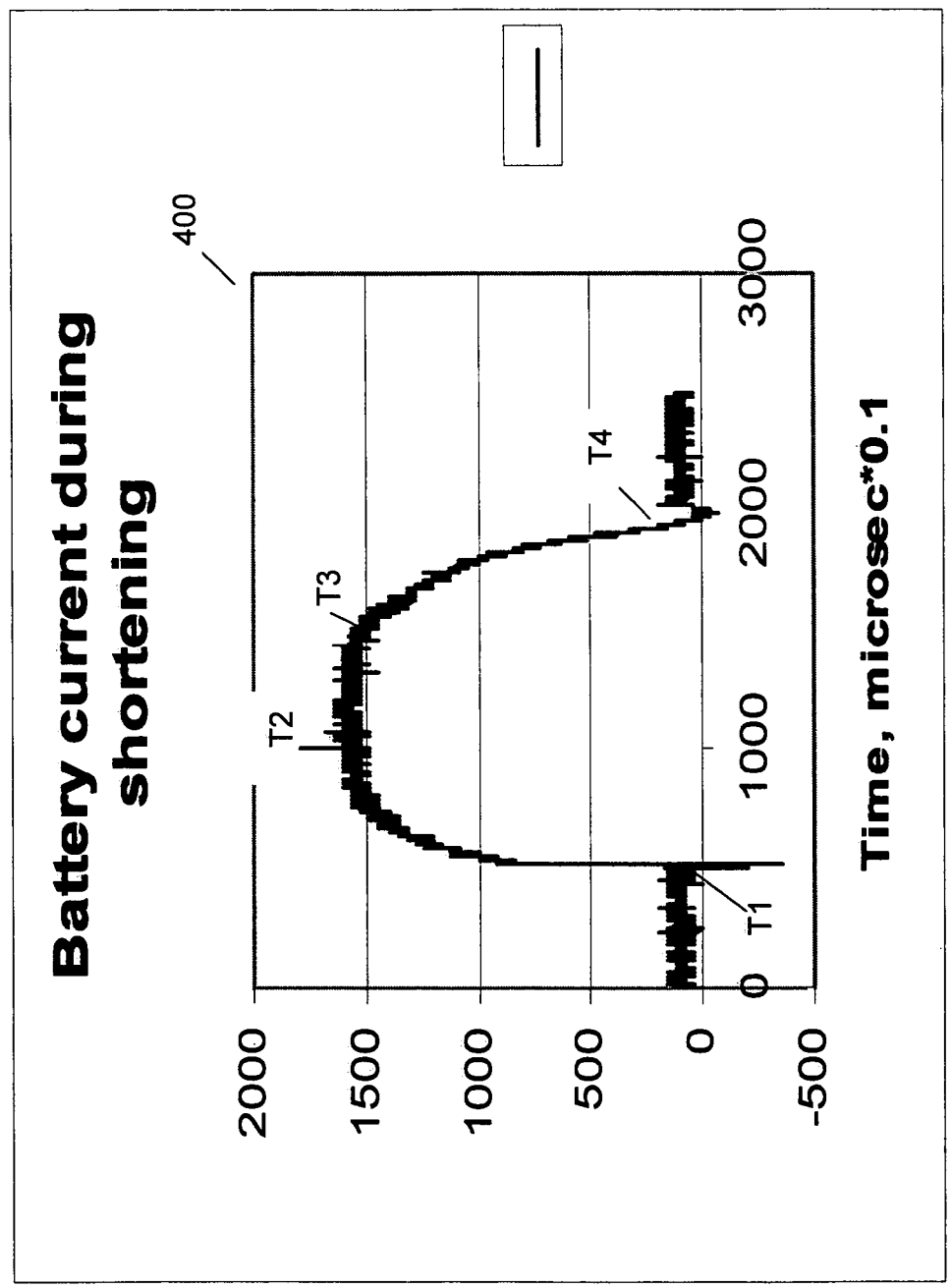
FIG. 4 is a graph of battery current during load remaining as a function of time.

The reason for the increase of tested battery voltage (V4) (higher than the initial $U_{OC}$ voltage (V1)) relates to a charging process which occurs as a result of a fast load remaining process which produces EMF in the inductive elements that later charges the snubber circuit capacitor. The capacitor returns part of its accumulated energy to the battery (as back current) (as was explained above in reference to FIG. 1). As a result of high battery current produced during short battery loading interval, a specific battery discharge can be produced and the voltage may be decreased at the end of this loading interval. As part of discharged energy accumulated in the capacitor returns to the battery as the back current decreases, the battery voltage drop after the measurement is less, in comparison to prior art techniques. Experiments made on batteries using the aforementioned shorting method, showed that the voltage drop after battery shortening is categorically less then 1 mV. Referring to FIG. 4, graph 400 shows the current change during battery shortening (I-t) in relation to time. Immediately after load on (t1), the current rises to a maximum value (t2), (but in comparison with FIG. 1, it is noted that the current rising rate is smaller than the voltage rate). The reason for the different behavior of the voltage and the current, relates the inductive EMF produced in the tester cable wires and in the battery.

Thereafter, the load is constantly decreased, the current drops down to zero level (t3), reaches to a negative value (t4) for a short time period, and climbs back to zero level (t5). Negative current (t4) (parallel to V4 in FIG. 3) is a result of produced back current flowing from the capacitor (to the battery direction) that later charges the battery (as was explained in FIG. 1). If the 106 capacity of capacitor 106 is too small, a high voltage is created during the load decreasing, thus damaging the electric circuit. However if the capacitor's capacity is too large, a maximum voltage is created on the capacitor nearby the battery $U_{OC}$, hence, it may prevent the battery charging (by the back current) and results inaccurate measurements of the SOC and the SOH.

In this respect, circuit 100 should be equipped with an appropriate capacitor (e.g. if the capacity is too small the circuit may be damaged) that will create an amount of voltage (higher than the tested battery voltage) insuring the creation of a back current for charging the tested battery.

Figure 5:
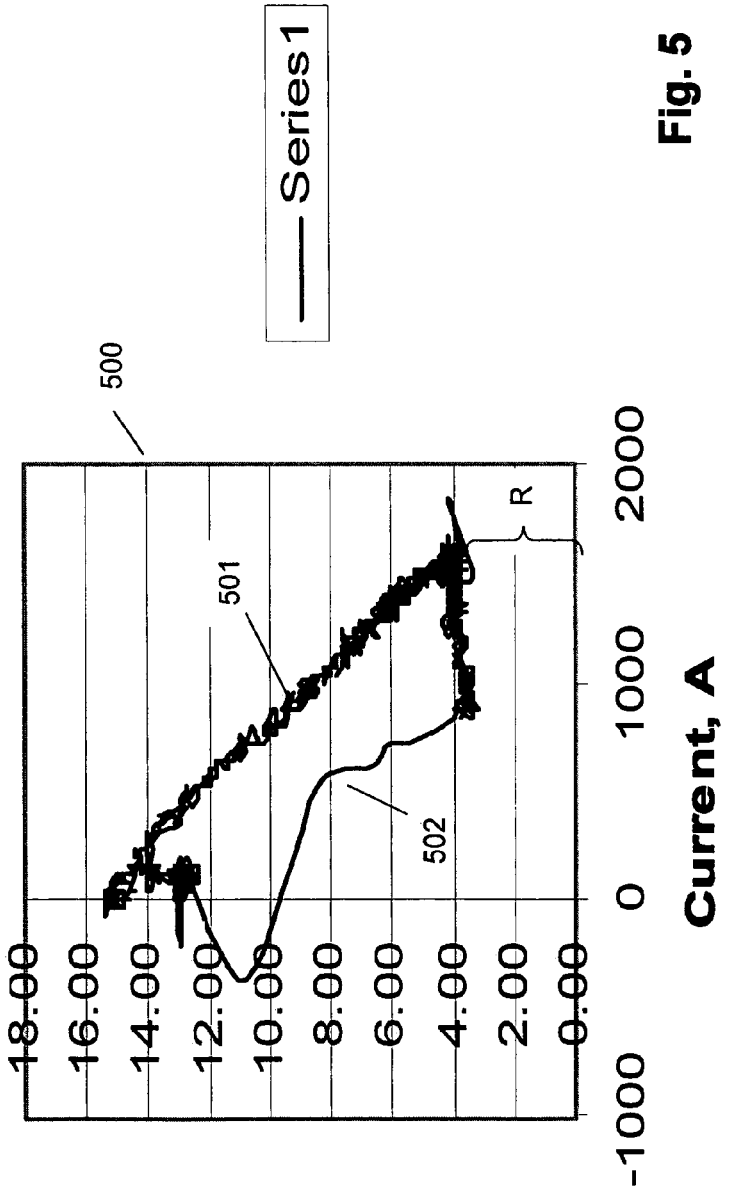
FIG. 5 is a graph of voltage during loading up and loading down as a function of current.

Referring to FIG. 5, graph 500 describes two distinct curves of a voltage change as a function of ampere during battery loading (V-A). Curve 501, describes V-I during load decrease, while curve 502 describes V-I during load increase.

The fact that curve 501 is linear (while curve 502 is complex and not linear at all) contributes to the ability to measure exact measurements, based on curve 501, during the battery measurement process.

Figure 6:
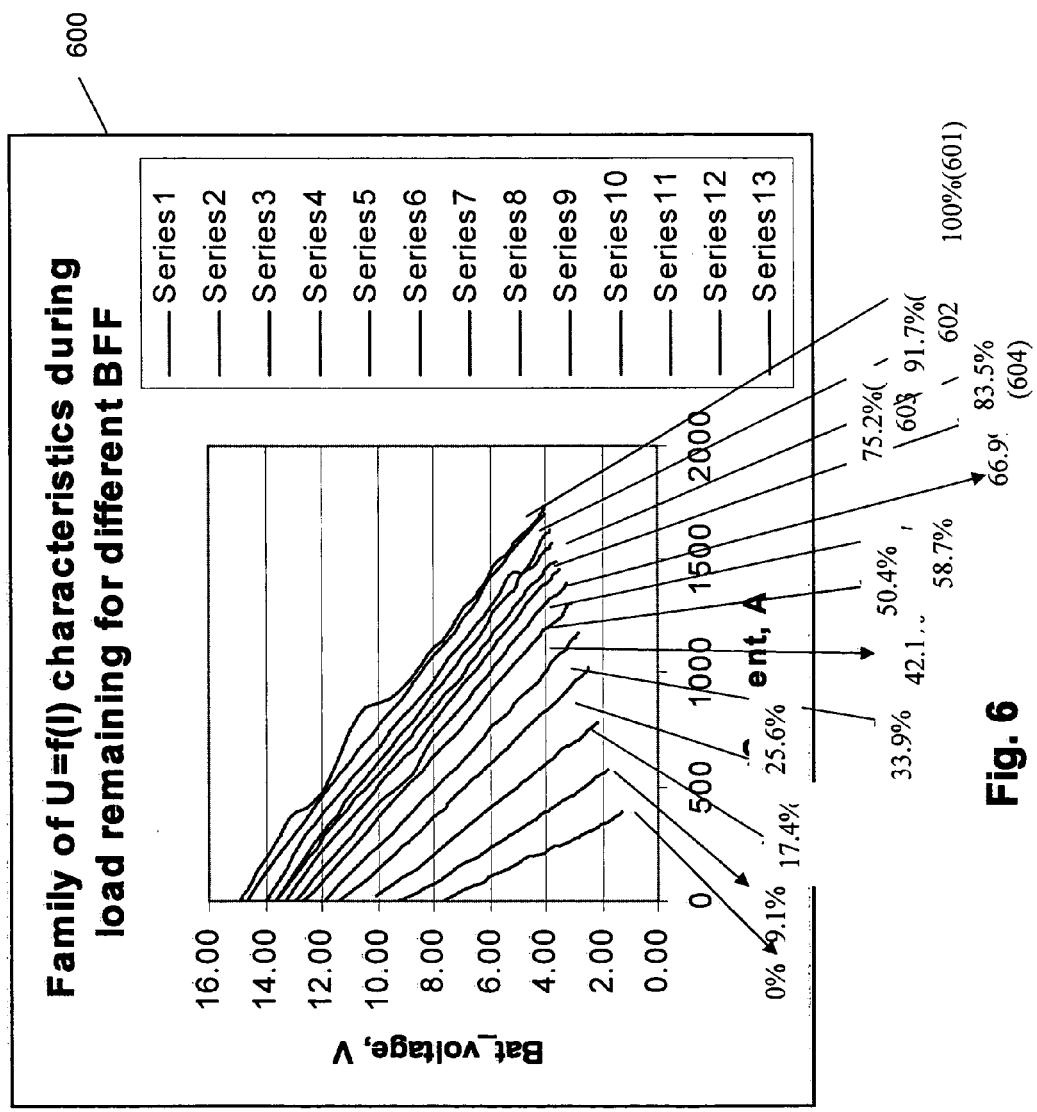
FIG. 6 illustrates different predefined V-I curves relating to different SOC.

FIG. 6 illustrates different predefined individual V-I curves 600 relating to, respectively, different SOC of 100%, 93%, 86% and 79%, of curves 601, 602, 603 604 etc. The different SOC were received by activating a specific load remaining on circuit 100 which was described on FIG. 1. The results of tested battery 101 (voltage and ampere, as are shown in graphs 300 and 400) are compared, by microcontroller 115, to I-V graph 600, for receiving the SOC of tested battery 101. The I-V curves 600 are not depended upon battery sizing and relate to different battery types giving varying capacity and CCA values. The I-V curves 600 depend on the load remaining rate. Thus, for receiving an accurate SOC, a calibration of tester algorithm is preformed before every unloading operation. In addition, as a result of battery temperature influence, the tested battery temperatures are added during the calibration.

In comparison to other testing methods, the present invention provides results of wide voltage ranges on the battery poles when load current remains at zero value). The Vzero-load(I.E the voltage measurement when current load returns to zero value) presented in the graph is between 7.5-15V, these results enable more accurate SOC measurements. For example, the Vzero-load range received by measuring the battery voltage (in open-circuit tests when battery capacitance changes from 100% to 0%) is only 2V (the diapason is between ~11-13V).

Figure 7:
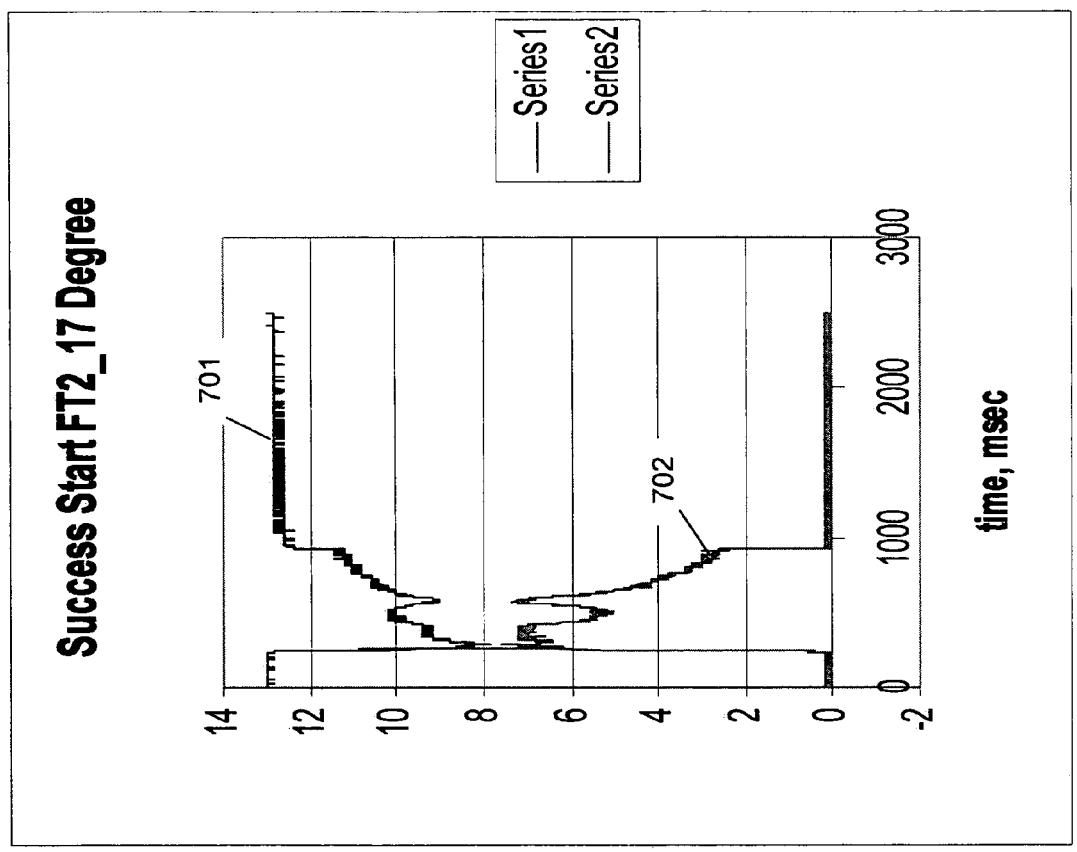
FIG. 7 is a graph of battery voltage and current during success engine starting.

Referring to FIG. 7, a V-t (Voltage-time) curve 701 and an 1-t (current-time) curve 702 of the tested battery, are presented during a successful engine start.

With reference to the V-t curve 701, a certain drop voltage occurs (depending on battery conditions) as a result of engine starting process. The curve V-t stabilizes, and oscillates until the engine is successfully started.

With reference to the l-t curve 702, it can be seen that the current rises to a substantial value for a short period of time, immediately after the starter is switched on. This behavior of the current is a result of insufficient back EMF which is produced by the rotated electric motor armature, In the next time period, as a result of oscillated resistive force (resistive torque moment) produced from the revolving action of the engine's crank, the current drops and oscillates until the engine is successfully started.

The engine crank's revolving action affects all piston movement in engine cylinders. Pistons participate in different engine cycles such as: sucking, compression, expansion and exhaust. The cycles are characterized by different forces, which depend on the specific crank's angle. As a result of resistive force change during the piston movement, the starter motor is affected by varying resistive torque. This resistive torque movement is created due to angle differences, which changes periodically when engine crank rotates around its axes (due to the starter motor operation). The periodical changes of torque movement against the starter, produce oscillated motor current, since DC electrical motor consumes the current which is proportional to its torque.

In the case of unsuccessful engine starting (usually, a result of inappropriate battery condition) crank movement begins, and continues only for a short period of time. The next crank movement will be halted and stopped. because one of the pistons, which participates in the compression cycle, meets the increasing resisting force (which is greater than the starter motor maximum torque when starter motor is energized by a battery with improper operating conditions). In case of unsuccessful start, the starter current will achieve its maximum possible value and will slightly fall with time as consequence of growing internal battery resistance, and decreasing internal EMF of the battery (as a result of quick battery discharge). In the event of unsuccessful starting, the dynamic behavior of the starting system is very different from the behavior in a successful starting. The underlying assumption is that if, it is possible to calculate the dynamic behavior of this system, it is therefore also possible to predict the success of the engine starting.

The dynamic behavior of all starting systems, which includes battery-starter-engine, is predicted by defining an equivalent circuit, and calculating its properties by a set of differential equations as shown in FIG. 8. The shown equivalent circuit, is appropriate to a starter motor, which is usually a serial DC electrical motor. In other starter categories (based on shunt motor, compound or permanent magnet motors) a different equivalent circuit, which produces an appropriate solution (of appropriate differential equations) for the system, should be used.

Referring to FIG. 8, battery 801 couples to starter's electrical equivalent circuit 804 at contact A. Battery 801 comprises an internal EMF $E_B$ 802 and an internal resistance $R_B$ 803; the electrical equivalent of starter circuit 804 comprises an inductivity $L_s$ 805 of (series) winding, and inductivity $L_A$ 806 of motor armature, resistive element $R_S$ 807 of serial winding and resistive element $R_A$ 808 of motor armature, and back $EMF E_A$ 809 which is produced in armature 810. The electrical starter is coupled to the engine crank 811 which is moved by gear 812. The crank 811 causes the pistons 813 to move within engine cylinders 614.

As mentioned above, the dynamic behavior of starting system is predicted by the solution of a differential equations set, presented below, which are based on circuit 800.

The following terms shall be used in the series of differential equations which will follow, and should have the meaning ascribed to them below unless otherwise specified: $J_T$—the total equivalent moment of inertia of all moving parts of the system (referring to the axis of starter motor); $\omega_M$ the rotation velocity of starter motor; $\alpha_M$ the angle of starter motor rotor; $\omega_{nom}$ the nominal velocity of starter motor; $\tau_M$ the movement torque of starter motor; $\tau_R$ the equivalent resistive engine torque applied on the axis of the starter motor. This equivalent torque is mainly depended on cranking angle. It is further depended on engine type, engine volume $V_E$, and engine temperature $\theta \tau_{FR}$ the internal resistive torque moment of the electrical starter motor, depends on different motor parameters such as: rotation velocity, current etc.

In the differential equations system, equation (1) represents the second Kirhgoff circuit law; equation (2) represents the function of back EMF produced in motor armature as a result of its rotation) velocity $\omega_M$ and of the stater magnetic field; equation (3) determines the producing of movement motor torque $\tau_M$; equation (4) represents the second Newton law for rotating mass; and equation (5) represents resistive engine torque which is activated against starter motor movement.

Figures 9A, 9B:
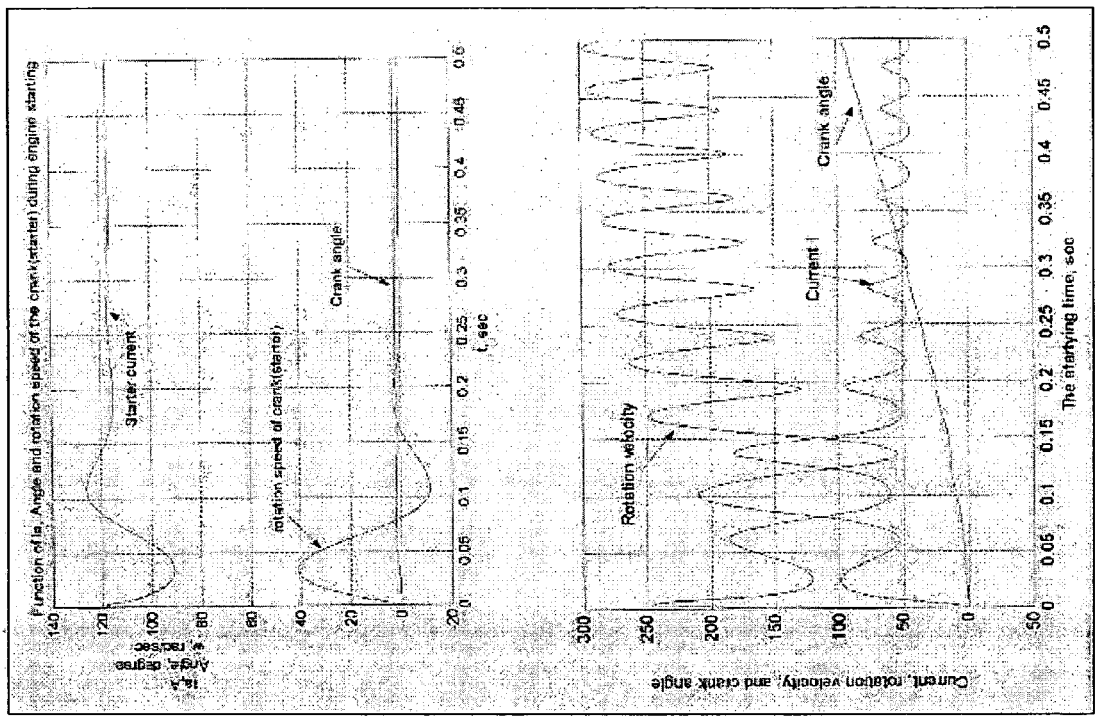
FIGS. 9A, 9B shows a graph of voltage, current and velocity as a function of time of a starter motor, during successful/unsuccessful engine starting.

FIGS. 9A and 9B shows graphs of voltage, current and velocity, of starter motor, as a function of time during successful engine starting and unsuccessful engine starting scenarios respectively. These graphs, which is received by solution of a given mathematical equation system for given mathematical model, resembles the predicting model shown on FIG. 6. Thus, the accuracy of the predicting model is correct.

Figure 10:
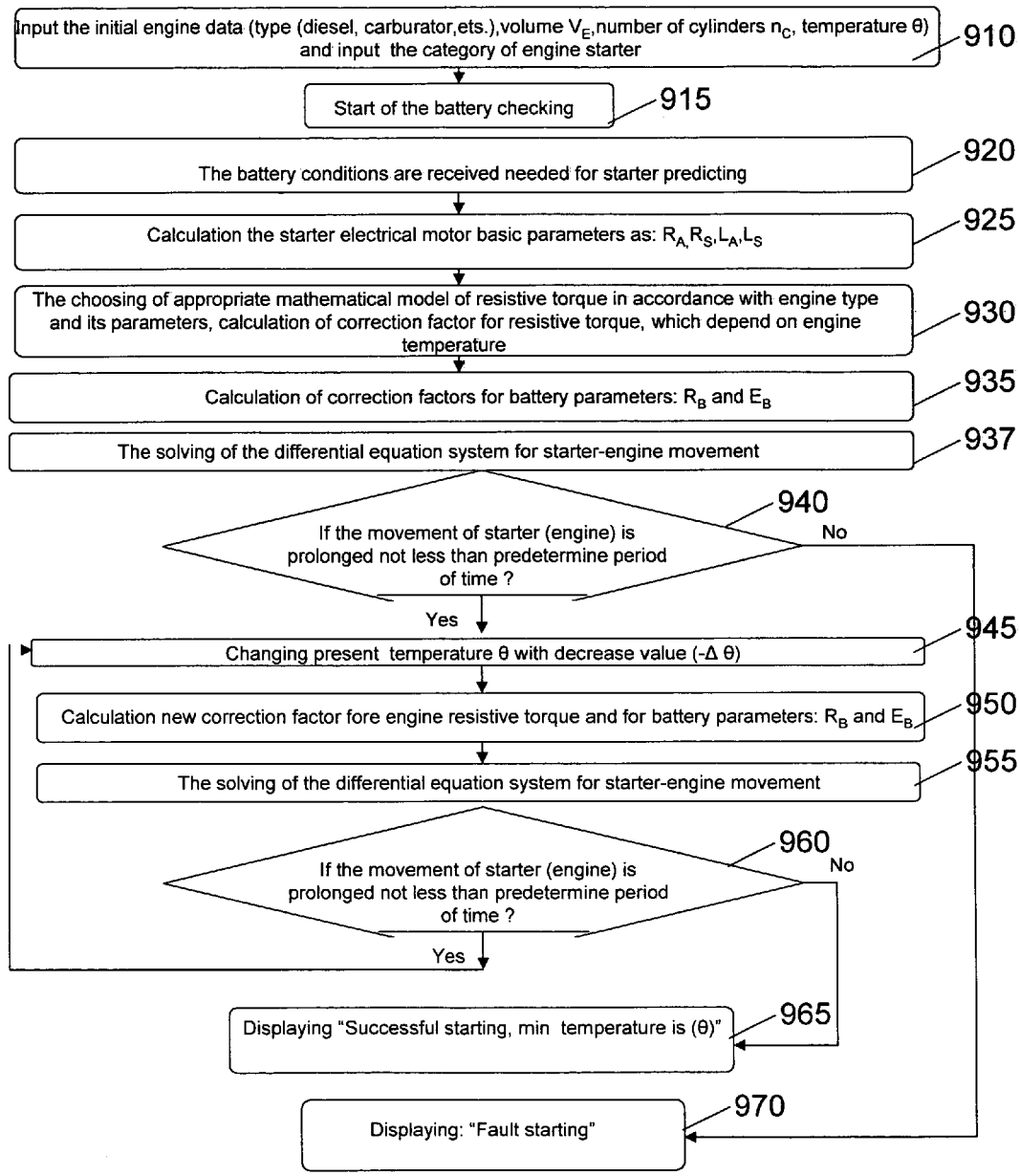
FIG. 10 is a flowchart diagram of evaluation engine starting possibility.

A flowchart for determining a successful engine starting is shown in FIG. 10.

The testing process begins by entering an initial engine data 910 such as engine type (diesel, full injection or carburetor), engine volume $V_E$, number of engine cylinders n, the present engine temperature, and starter category (based on series (DC) motor, permanent magnet motor or other).

At the next stage 915, the battery checking process is activated; hence the tested battery conditions ($R_B$, $E_B$) have been calculated (step 920). An algorithm is activated in the next step 925 in an automatic manner, based on the engine type, the engine volume $V_E$, and starter motor circuit parameters ($R_A$, $R_S$, $L_A$, $L_S$). In the next step 930 the mathematical model of the engine resistive torque is chosen based on the engine type, the engine volume $V_E$, and number of cylinder $n_C$.

(In step 935 the correction factor for battery parameters $E_B$ $R_B$ are calculated for a given temperature.) When the temperature decreases, the EMF of the tested battery $E_B$ slightly decreases and the internal resistance $R_B$ increases proportionally with respect to temperature change.

In step 937, differential equations of battery-starter-engine system are solved, thus the parameters of the starter (engine) movement are received.

If the starter movement is shortened to bellow a predetermined period of time and crank velocity is less than minimum needed value (the minimum time and velocity required for engine starting) the message "FAULT STARTING" is displayed 970 (other appropriated messages, related to unsuccessful starting, may be displayed).

In case of an estimated prolonged movement of the engine starter ( ) the controller reduces the tested temperature θ to a lower temperature value (−Δθ) (step 945).

For example, Δθ may be equal to one Celsius degree.

In the next step 950, management program calculates new correction factors for engine resistive torque $\tau_R$ and for battery parameters $R_B$, $E_B$ as a result of new determined temperature. In step 955, measuring program solves the differential equation system based on new changed temperature. In the next step 960 the movement duration is checked. If the duration is less than a predetermined period of time, the message: "Successful starting, minimum temperature of starting is (θ)" is displayed (step 965). The, displayed temperature is the last tested temperature. If the movement duration is longer than predetermined time period and the velocity of starter motor is not lower than minimum required value, the program returns to step 940 for decreasing temperature and for activating new temperature correction process. The calculation process continues in accordance with the algorithm results until a negative answer is received in step 960.

Figure 11:
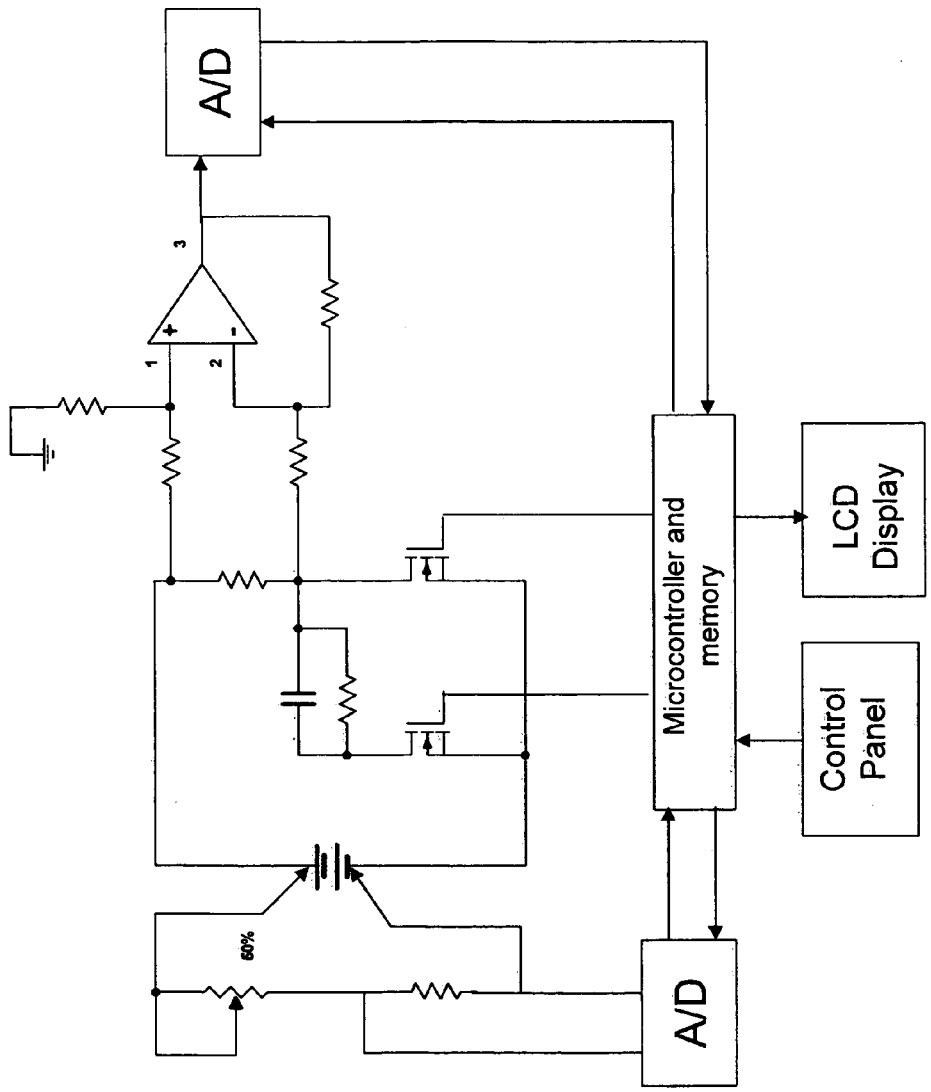
FIG. 11 is another embodiment of a battery testing system for implementing the method of the present invention.

Another embodiment of a battery testing system 190 for implementing the method of the present invention is shown in FIG. 11.

The circuit shown in this figure is similar to the circuit shown in FIG. 3 except that the design of the snubber circuit is different, hence enabling to activate the snubber differently.

The snubber design according to this embodiment includes a capacitor connected in parallel to a resistor and serially to a power switch. The controller activates the snubber circuit before activating the remaining load operation.

Figure 12:
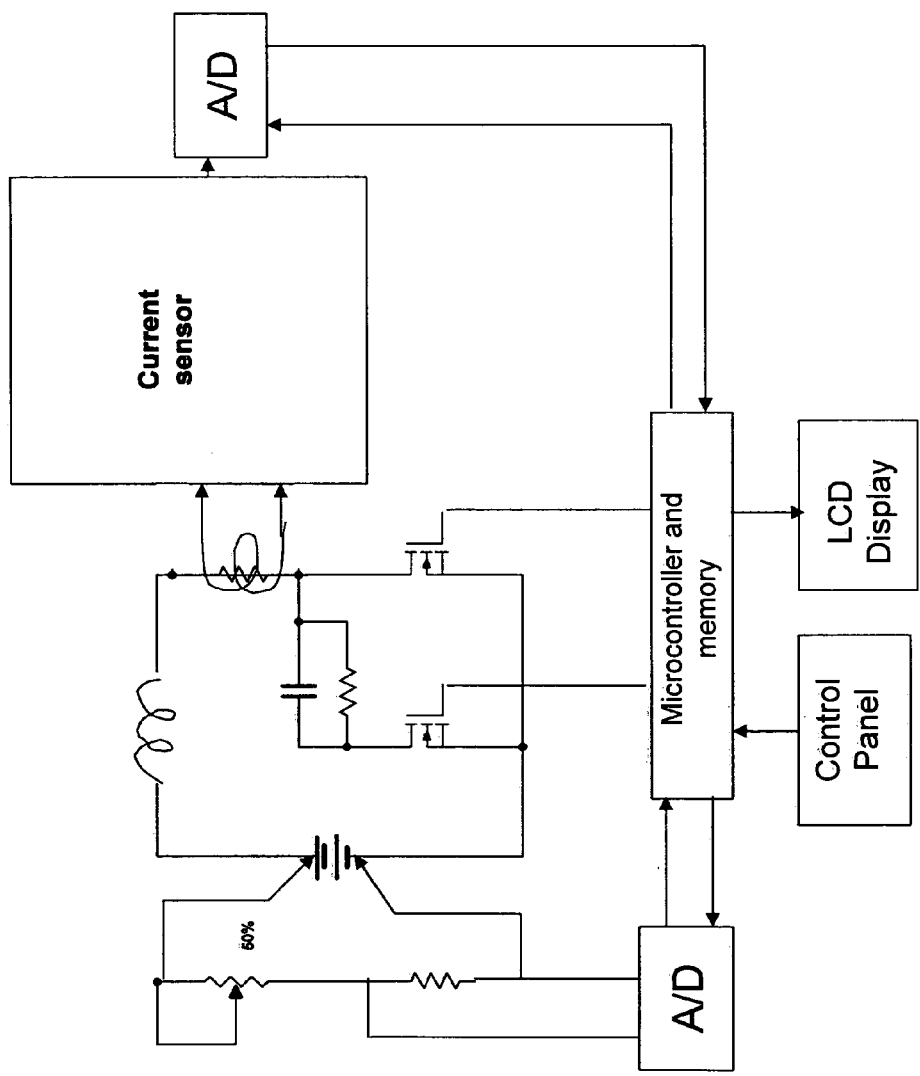
FIG. 12 is a further embodiment of a battery testing system for implementing the method of the present invention.

A further embodiment of a battery testing system 190 for implementing the method of the present invention is shown in FIG. 12. The circuit shown in this figure is similar to the circuit shown in FIG. 3 except that the design include designated inductivity components in the loading circuit. These additional components enlarge the effect of natural inductivity for producing increased back current and for preventing energy losses during shortening process.

While the above description contains many specifities, these should not be construed as limitations on the scope of the invention, but rather as exemplifications of the preferred embodiments. Those skilled in the art will envision other possible variations that are within its scope. Accordingly, the scope of the invention should be determined not by the embodiment illustrated, but by the appended claims and their legal equivalents.

What is claimed is:

1. A method for measuring a battery's condition, comprising the steps of:
   a) shortening between battery poles by using a designated electric circuit for a short time period, producing high current in said electric circuit, wherein the designated electric circuit is designed to carry high current load;
   b) measuring process data including voltage and current during said time period;
   c) storing measurements of said process data;
   d) analyzing the condition of said battery based on predetermined battery parameters and said process data measurements.

2. The method of claim 1 wherein the analyzing process includes the steps of checking the correlation between measured current and voltage respective to time and comparing same to predefined current/voltage correlations.

3. The method of claim 1, enabling to check condition of the battery testing clamps contacts, further comprising the steps of evaluating clamps contacts condition by comparing measured process data to predefined values.

4. The method of claim 1 wherein said analysis includes a comparison of said measured data to a predefined battery condition table.

5. The method of claim 1 wherein said short time period ranges between 10 μsec and 50 μsec.

6. The method of claim 1 wherein the high current produced ranges between 20-60 A for every 1 Ah of battery capacitance.

7. The method of claim 1, wherein said conditions include CCA, SOC and SOH.

8. The method of claim 1, wherein said battery includes automotive accumulators, accumulators for UPS systems and solar energy unit.

9. The method of claim 1 wherein said snubber circuit includes a capacitor connected to at least one resistor and at least one diode.

10. The method of claim 1 wherein the snubber circuit includes a capacitor connected in parallel to at least one resistor and serially to one power switch.

11. The method of claim 10, wherein the snubber circuit is activated before the load decrease.

12. An apparatus for measuring battery condition by shortening between battery poles for a short time period of 10 μsec to 50 μsec producing high current, said apparatus comprised of:
    snubber circuit enabling to prevent results of rapid current decreasing;
    at least two resistors enabling accurate measurement of voltage;
    A/D converter for receiving digital output data of analog measurements;
    microcontroller for analyzing measured data based on predefined battery parameters values;
    display unit for presenting output results of battery condition.

13. The apparatus of claim 1 wherein the snubber circuit includes a capacitor connected to at least one resistor and at least one diode.

14. The apparatus of claim 1 wherein the snubber circuit includes a capacitor connected in parallel to at least one resistor and serially to one power switch.

15. The apparatus of claim 1 wherein the snubber circuit includes a designated inductive components for increased back current and for preventing energy losses during shortening process.

* * * * *